United States Patent
Tezak et al.

(10) Patent No.: US 10,461,853 B1
(45) Date of Patent: *Oct. 29, 2019

(54) OPTICAL MEMORY GATES

(71) Applicant: Hewlett Packard Enterprise Development LP, Houston, TX (US)

(72) Inventors: Nikolas A. Tezak, Palo Alto, CA (US); David Kielpinski, Palo Alto, CA (US); Jason Pelc, Palo Alto, CA (US); Thomas Van Vaerenbergh, Palo Alto, CA (US); Ranojoy Bose, Palo Alto, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/210,388

(22) Filed: Dec. 5, 2018

Related U.S. Application Data

(63) Continuation of application No. 15/139,971, filed on Apr. 27, 2016, now Pat. No. 10,181,898.

(51) Int. Cl.
| | | |
|---|---|---|
| *H04B 10/079* | (2013.01) | |
| *G02B 6/293* | (2006.01) | |
| *H04B 10/80* | (2013.01) | |
| *G11C 13/04* | (2006.01) | |

(52) U.S. Cl.
CPC ... *H04B 10/07955* (2013.01); *G02B 6/29335* (2013.01); *G02B 6/29338* (2013.01); *G11C 13/048* (2013.01); *H04B 10/80* (2013.01)

(58) Field of Classification Search
CPC .............. H04B 10/07955; H04B 10/80; G02B 6/29338; G11C 13/048
See application file for complete search history.

(56) References Cited

U.S. PATENT DOCUMENTS

| | | | |
|---|---|---|---|
| 5,317,453 | A | 5/1994 | Nishimura et al. |
| 6,522,462 | B2 | 2/2003 | Chu et al. |
| 7,053,359 | B2 | 5/2006 | Ponomarenko |
| (Continued) | | | |

FOREIGN PATENT DOCUMENTS

| | | |
|---|---|---|
| CN | 101039011 A | 9/2007 |
| CN | 102384716 A | 3/2012 |
| (Continued) | | |

OTHER PUBLICATIONS

Mabuchi, H.; "Cavity-QED models of switches for attojoule-scale nanophotonic logic"; Physical Review A,; (2009); 4 pages.
(Continued)

*Primary Examiner* — Mina M Shalaby
(74) *Attorney, Agent, or Firm* — Hewlett Packard Enterprise Patent Department

(57) ABSTRACT

In example implementations, an optical gate is provided. The optical gate receives at least one optical signal via a waveguide of an optical memory gate. The optical gate compares a wavelength of the at least one optical signal to a resonant wavelength associated with a resonator. When the wavelength of the at least one optical signal matches the resonant wavelength, a value that is stored in the resonator is read out via the at least one optical signal. Then, the at least one optical signal with the value that is read out is transmitted out of the optical gate.

13 Claims, 4 Drawing Sheets

(56) References Cited

U.S. PATENT DOCUMENTS

| | | | |
|---|---|---|---|
| 7,515,775 | B1 | 4/2009 | Kucharski et al. |
| 9,083,460 | B1* | 7/2015 | Zortman .......... H04B 10/50575 |
| 2002/0015554 | A1 | 2/2002 | Oguma et al. |
| 2006/0215949 | A1* | 9/2006 | Lipson ................ G02F 1/025 385/2 |
| 2010/0189441 | A1 | 7/2010 | Bolla et al. |
| 2011/0293216 | A1* | 12/2011 | Lipson ............... G02B 6/12007 385/14 |
| 2013/0294782 | A1 | 11/2013 | Liboiron-Ladouceur et al. |
| 2014/0101512 | A1 | 4/2014 | Djordjevic et al. |
| 2014/0317477 | A1 | 10/2014 | Chang et al. |
| 2014/0376851 | A1* | 12/2014 | Akiyama ............ G02F 1/0147 385/2 |

FOREIGN PATENT DOCUMENTS

| | | |
|---|---|---|
| EP | 0629896 | 10/2001 |
| EP | 1411642 A1 | 4/2004 |
| WO | WO-8601007 A1 | 2/1986 |
| WO | WO-0190813 A2 | 11/2001 |
| WO | WO-2010025256 | 3/2010 |
| WO | WO-2010103481 | 9/2010 |

OTHER PUBLICATIONS

Notomi, M. et al.; "On-Chip All-Optical Switching and Memory by Silicon Photonic Crystal Nanocavities"; (Research Paper), Advances in Optical Technologies, Apr. 13, 2008.

Nozaki, K., et al.; "Ultralow-power all-optical RAM based on nanocavities"; Nature Photonics 6, pp. 248-252 (2012).

Shinya, A., et al; "All-optical Flip-flop Circuit Composed of Coupled Two-port Resonant Tunneling Filter in Two-dimensional Photonic Crystal Slab"; (Research Paper), Optics Express, vol. 14, No. 3, 2006, pp. 1230-1235.

Tanabe, T., et al.; "Fast bistable all-optical switch and memory on a silicon photonic crystal on-chip"; Opt. Lett. 30; 2575-2577; (2005).

Yanik, M. F., et al.; "All-optical transistor action with bistable switching in a photonic crystal cross-waveguide geometry"; Opt. Lett. 28, 2506-2508 (2003).

Djordjevic, I.B. et al., "Advanced Schemes for All-optical Computing, Optical Error Correction, and Optical Signal Processing," (Research Paper), Jul. 5-9, 2015, 6 pages.

International Preliminary Report on Patentability received for PCT Patent Application No. PCT/US2015/060695, dated May 24, 2018, 7 pages.

Mellanox Technologies. (2011). FDR InfiniBand is Here.

Pavlichin, D. S., et al.; (2014). Photonic circuits for iterative decoding of a class of low-density parity-check codes. New Journal of Physics, 16(10), 105017.

PCT InternationalSearch Report cited in Appl. No. PCT/US2015/060695 dated Aug. 9, 2016; 3 pages.

Sipser, M., et al; (1994). Expander codes. In Proceedings 35th Annual Symposium on Foundations of Computer Science {vol. 42, pp. 566-576).

Vasic, B. et al., "Low-density Parity Check Codes and Iterative Decoding for Long-haul Optical Communication Systems," (Research Paper), Feb. 2003, 9 pages.

Rakshit et al., "Design of Micro-Ring Resonator Based All-Optical Parity Generator and Checker Circuit", (published in Elsevier Optical Communications, vol. 303, Apr. 2013, pp. 30-37.

* cited by examiner

OPTICAL MEMORY GATES

STATEMENT OF GOVERNMENT INTEREST

This invention was made with government support under Contract No. N66001-12-2-4007, awarded by Defense Advanced Research Projects Agency. The government has certain rights in this invention.

BACKGROUND

Optical communication is the leading solution for high speed, high bandwidth exchange of digital information. Optical communications transmit information over long distances using light signals over light transmitting mediums, such as optical fibers and waveguides.

Information can be carried by the light signals using different types of light sources as optical transmitters (e.g., light emitting diodes (LEDs), infrared light, lasers, and the like). A light signal can be encoded using different types of modulation schemes to vary the optical phase or intensity of the light signal.

Currently, optical signals used for digital communications are processed as electrical signals. However, processing the optical signals as electrical signals uses expensive conversions.

DETAILED DESCRIPTION

The present disclosure discloses an example optical memory gate. The optical memory gate may be power switchable and handle a plurality of different wavelength optical signals that pass through the optical memory gate. In addition, the memory state of the optical memory gate may be reset.

As a result, the optical memory gate of the present disclosure does not use expensive conversions to convert the optical signal into an electrical signal for processing. The optical memory gate of the present disclosure can be used for a variety of different applications, such as, an all optical system for detecting bit errors in optical signals, and the like.

Figure 1:
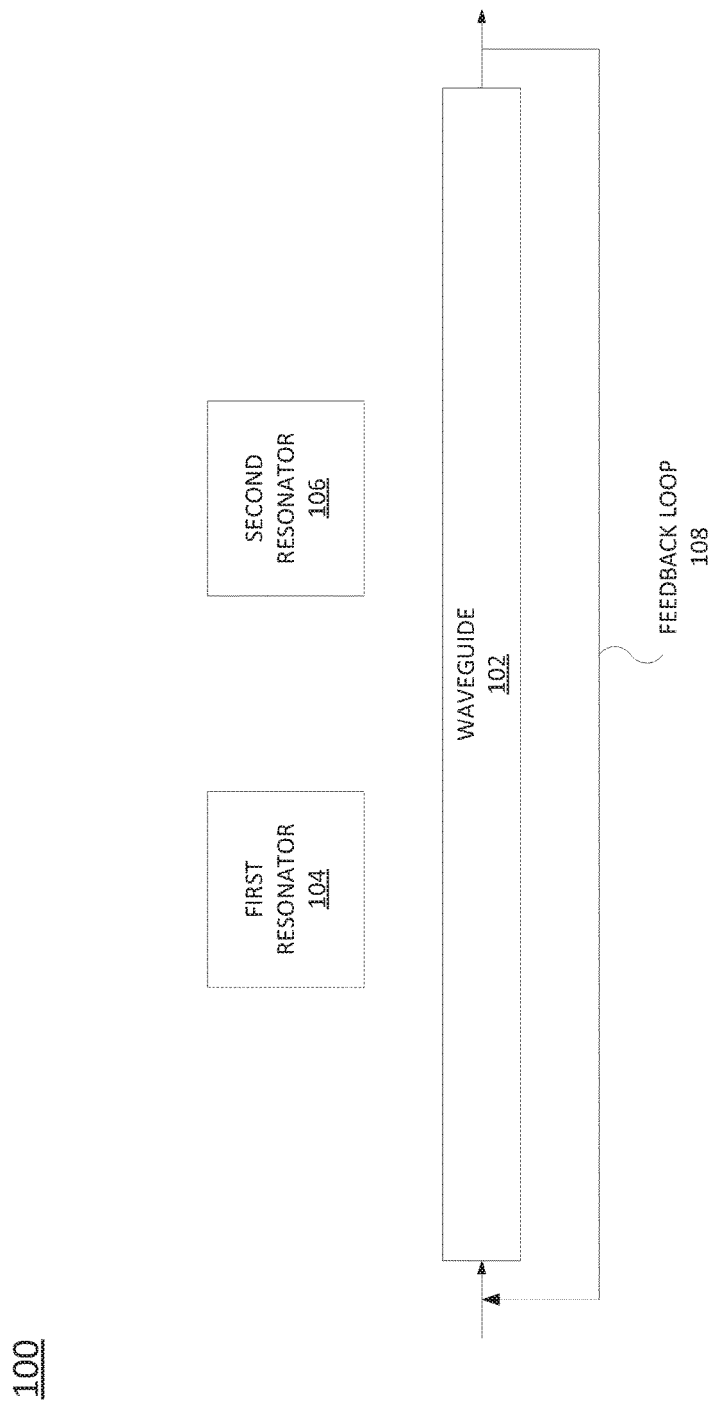
FIG. 1 is a block diagram of an example apparatus of the present disclosure.

FIG. 1 illustrates a block diagram an example apparatus 100 of the present disclosure. The apparatus 100 may include a waveguide 102, a first resonator 104, a second resonator 106 and a feedback loop 108. A plurality of optical signals may enter the waveguide 102 and propagate along the waveguide 102. Some of the plurality of optical signals may include read out optical signals that can read out a value stored in the first resonator 104 and exit the waveguide 102. One of the plurality of optical signals may be a pump optical signal that is used to power the apparatus 100.

In one implementation, the first resonator 104 may store a value of 0 or 1. A high power state of the first resonator 104 may be associated with the value of 1 and a low power state of the first resonator 104 may be associated with the value of 0. In one implementation, the first resonator 104 may be associated with a resonant wavelength. In some implementations, the first resonator 104 may be associated with more than one resonant wavelength. When a wavelength of one of the read out optical signals matches the resonant wavelength, or one of a plurality of resonant wavelengths, the value stored in the first resonator 104 may be read out by the read out optical signal.

In one example, when the value of 1 is stored in the first resonator 104, the value of 1 may be read out by the read out optical signal by applying a phase shift to the read out optical signal. The phase shift may be a phase shift of $\pi$ (i.e., "pi") in one example. When the value of 0 is stored in the first resonator 104, no phase shift may be applied and the value of 0 may be read out by the read out optical signal.

In one implementation, the second resonator 106 may be associated with a wavelength of the pump optical signal. The second resonator 106 may apply a phase shift to the pump optical signal to pass the pump power optical signal to the feedback loop 108. In one example, a phase shift of $\pi$ (i.e., "pi") may be applied by the second resonator 106.

In one example, the feedback loop 108 may be used to track a total amount of power associated with the apparatus 100. In one example, when the total amount of power of the apparatus 100 exceeds a power reset threshold value, the value stored in the first resonator 104 may be reset. For example, constructive interference between the optical signal in the feedback loop 108 and an optical signal that enters the waveguide 102 may lead to a buildup of optical power at a particular wavelength. When the buildup of optical power (e.g., the total amount of power in the apparatus 100) exceeds the power reset threshold, the value stored in the first resonator 104 may be reset.

Figure 2:
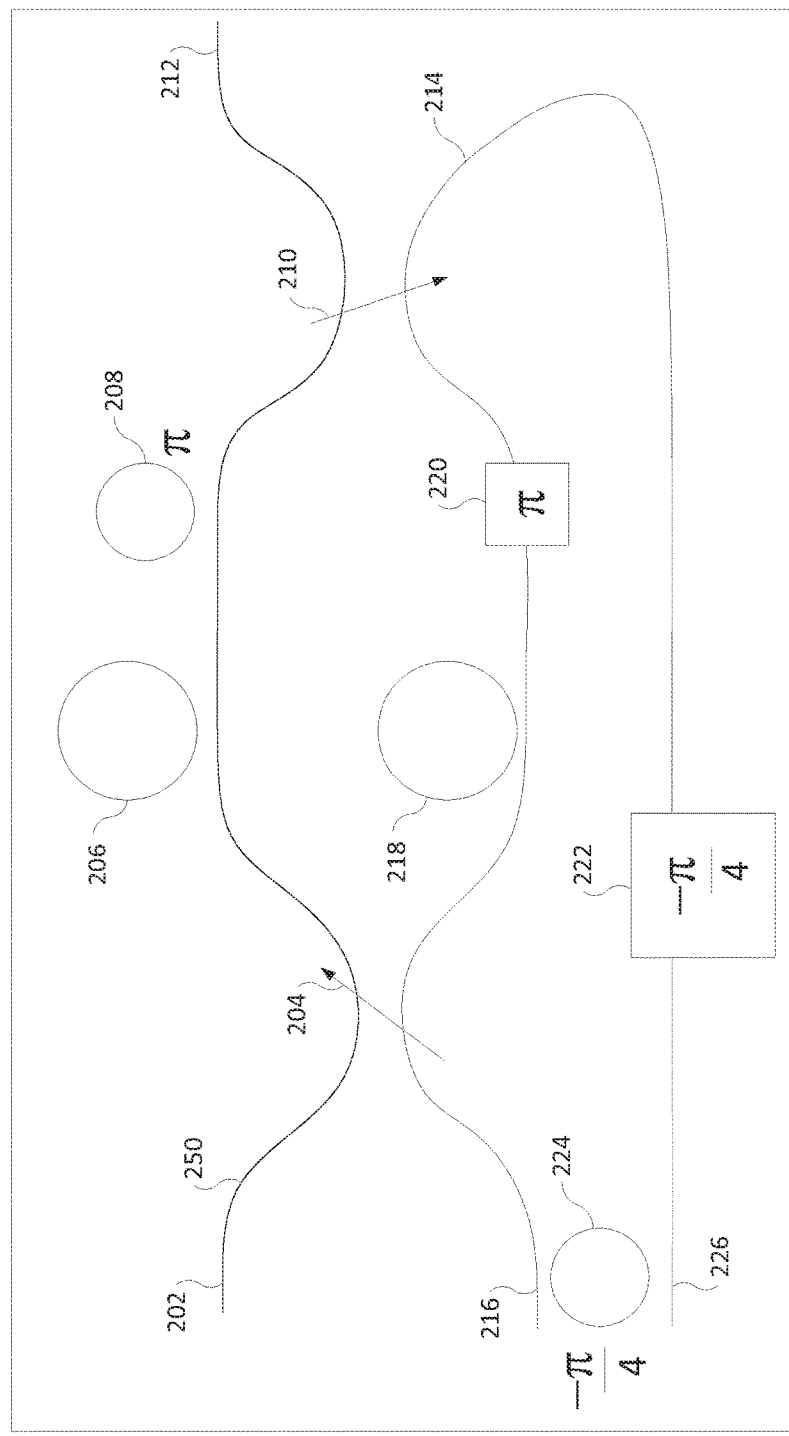
FIG. 2 is a block diagram of an example optical memory gate of the present disclosure.

In one implementation, the functions of the apparatus 100 may be deployed by an example optical memory gate 200 illustrated in FIG. 2. In one example, the optical memory gate 200 may include a waveguide 250 that includes an input 202, an input 216, an output 212 and an output 226. Optical signals (e.g., pump optical signals and read out optical signals) may enter the optical memory gate 200 via the input 202 or the input 216.

The optical memory gate 200 may include a first coupling device 204 and a second coupling device 210. In one example, the first coupling device 204 may allow optical signals in a feedback loop 214 to enter the waveguide 250. In one example, the second coupling device 210 may allow optical signals in the waveguide 250 to enter the feedback loop 214. In some implementations the first coupling device 204 and the second coupling device 210 may be deployed as a directional coupler or a multi-mode interferometer.

In one implementation, the optical memory gate 200 may include a first resonator 206 and a second resonator 208. The first resonator 206 may perform a similar function as the first resonator 104 illustrated in FIG. 1 and described above. For example, the first resonator 206 may store a value that can be read out by an optical signal.

In one implementation, the first resonator 206 may store a value of 0 or 1. A high power state of the first resonator 206 may be associated with the value of 1 and a low power state of the first resonator 206 may be associated with the value of 0. In one implementation, the first resonator 206 may be associated with a resonant wavelength. When a wavelength of one of the read out optical signals matches the resonant wavelength, the value stored in the first resonator 206 may be read out by the read out optical signal.

In one example, when the value of 1 is stored in the first resonator 206, the value of 1 may be read out by the read out optical signal by applying a phase shift to the read out optical signal. The phase shift may be a phase shift of $\pi$ (i.e., "pi") in one example. When the value of 0 is stored in the first resonator 206, no phase shift may be applied and the value of 0 may be read out by the read out optical signal.

In one example, the second resonator 208 may perform a similar function as the second resonator 106 illustrated in FIG. 1 and described above. For example, the second resonator 208 may be associated with a wavelength of the pump optical signal. The second resonator 208 may apply a phase shift to the pump optical signal to pass the pump power optical signal to the feedback loop 214. In one example, a phase shift of $\pi$ (i.e., "pi") may be applied by the second resonator 208.

In one example, the feedback loop 214 may include a third resonator 218. In one implementation, the first resonator 206 and the third resonator 218 may be non-linear micro-ring resonators, photonic crystal resonators, or any other type of resonant optical structure.

The third resonator 218 may also store a value. In one example, the value stored in the third resonator 218 may be different than the value stored in the first resonator 206. In other words, the third resonator 218 may be in a different power state than the first resonator 206. For example, when the first resonator 206 is in a high power state (e.g., storing a value of 1), the third resonator 218 may be in a low power state (e.g., storing a value of 0), and vice versa. The first resonator 206 and the third resonator 218 may work together on a read out optical signal to allow the read out optical signal to properly obtain the value stored in the first resonator 206, yet exit out of the waveguide 250 via the output 212.

In one implementation, the value stored in the first resonator 206 and the third resonator 218 may be initially set randomly. In another implementation, the value stored in the first resonator 206 and the third resonator 218 may be set deterministically based on a particular combination of input signals.

In one example, the feedback loop 214 promotes asymmetry in the optical power reaching the first resonator 206 and the third resonator 218. For example, when the first resonator 206 is in a high powered state, the feedback loop 214 reinforces this by interfering constructively at the first coupling device 204 such that the power reaching the first resonator 206 is greater than the power reaching the third resonator 218. This bi-stability implies two separate device states co-existing at identical optical input signals, thus, providing the optical memory gate 200 with a single bit of memory.

In one implementation, the feedback loop 214 may also include a first phase shifter 220 downstream from the third resonator 218 and upstream from the second coupling device 210. The feedback loop 214 may also include a second phase shifter 222 downstream from the first phase shifter 220 and downstream from the second coupling device 210. In one implementation, the second phase shifter 222 may apply a phase shift to allow a cavity filter 224 to filter out the pump power optical signal and allow the pump power optical signal to exit the output 226 of the feedback loop 214, The second phase shifter 222 may not apply the phase shift to read out optical signals. As a result, the cavity filter 224 may block read out optical signals from exiting the feedback loop 214 at the output 226 and any read out signals that enter the feedback loop 214 may exit via the output 226. Said another way, the first phase shifter 220 and the second phase shifter 222 ensure that in either stable power condition that the read out optical signals pick up opposite phase shifts from the first resonator 206 and the third resonator 218 and exit through the output 212.

In one implementation, the first phase shifter 220 may apply a phase shift of $\pi$ (i.e., "pi") to all optical signals. In one example, the phase shift applied by the second phase shifter 222 may be $(-\pi/4)$. It should be noted that the values of the phase shifts are provided as examples and that any amount of phase shift may be applied.

In one example, the power level of a single or multiple optical read out signals entering the optical memory gate 200 via the input 202 or 216 may become very large. The non-linearity of resonators 206 and 218 may then change the optical power in the feedback loop 214. As a result, the difference in the total optical power circulating inside the resonators 206 and 218 may become smaller. The optical memory gate 200 may be associated with a power reset threshold value. When the build-up of optical power exceeds the power reset threshold value, the first resonator 206 and the third resonator 218 may be reset. In other words, the values stored in the first resonator 206 and the third resonator 218 may be reset to an initial value or a random state value.

The optical memory gate 200 may be able to process a plurality of optical signals at different wavelengths. For example, the pump optical signal and the read out optical signals may be fed together into the optical memory gate 200, but at different wavelengths. In addition, the first resonator 206 may be associated with a plurality of different resonant wavelengths. As a result, multiple read out optical signals that match one of the plurality of different resonant wavelengths may read out the value stored in the first resonator 206.

Figure 3:
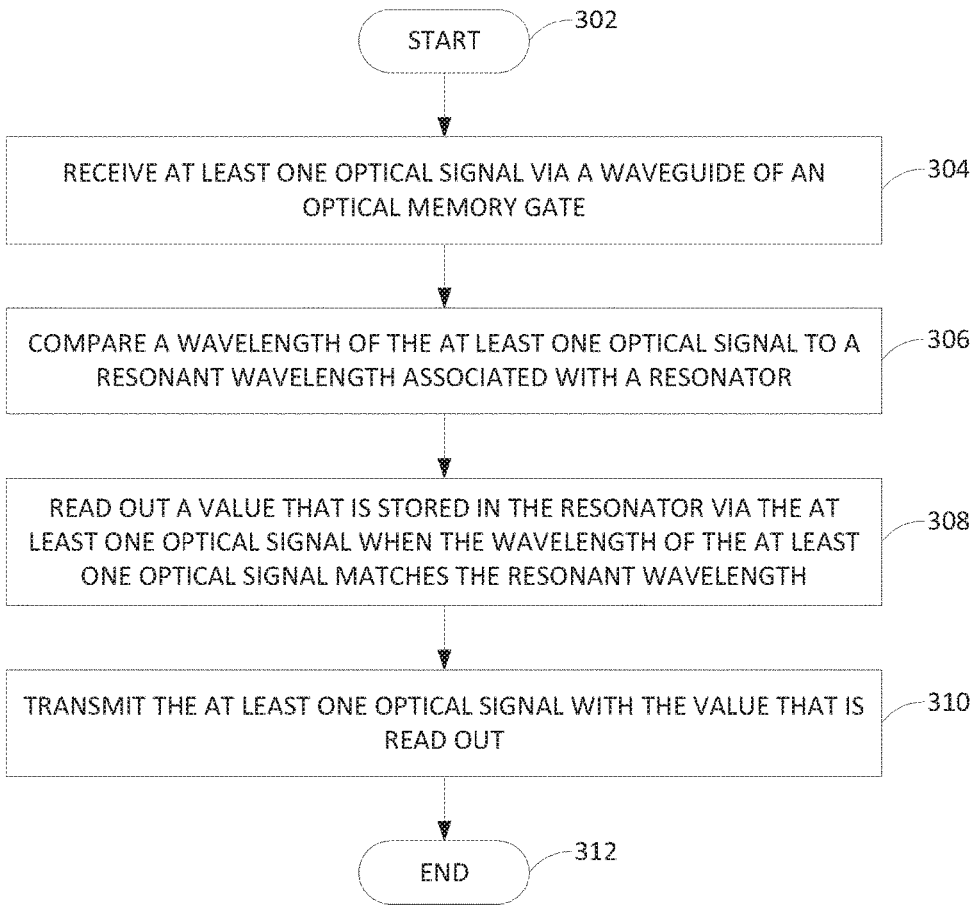
FIG. 3 is a flow diagram of an example method for transmitting an optical signal with a value that was stored in the optical memory gate.

FIG. 3 illustrates a flow diagram of an example method 300 for transmitting an optical signal with a value that was stored in the optical memory gate. In one example, the blocks of the method 300 may be performed by the apparatus 100 or the optical memory gate 200.

At block 302, the method 300 begins. At block 304, the method 300 receives at least one optical signal via a waveguide of an optical memory gate. For example, the at least one optical signal may be a read out optical signal that is used to read out values stored in a resonator.

At block 306, the method 300 compares a wavelength of the at least one optical signal to a resonant wavelength associated with a resonator. For example, the resonator may determine the wavelength associated with the at least one optical signal to determine if the wavelength matches the resonant wavelength associated with the resonator. In some implementations, the resonator may be associated with a plurality of different resonant wavelengths. Thus, the wavelength of the at least one optical signal may be compared to all of the plurality of different resonant wavelengths.

At block 308, the method 300 reads out a value that is stored in the resonator via the at least one optical signal when the wavelength of the at least one optical signal matches the resonant wavelength. For example, the resonator may store a value. In one implementation, the resonator may store a value of 1 associated with a high power state and a value of 0 associated with a low power state. When the wavelength of the at least one optical signal matches a resonant wavelength associated with the resonator, the at least one optical signal may read out the value stored in the resonator. For example, when the resonator is storing a value of 1 and is in a high powered state, a phase shift may be applied to the at least one optical signal. When the resonator is storing a value of 0 and is in a low powered state, no phase shift may be applied to the at least one optical signal indicating that the at least one optical signal has read out a value of 0 from the resonator.

At block 310, the method 300 transmits the at least one optical signal with the value that is read out. For example, the at least one optical signal may exit the waveguide via an output. The value may then be processed in accordance with a particular system that deploys the apparatus 100 or the optical memory gate 200.

In some implementations, the blocks described by the method 300 may be deployed with additional optical signals, such as a pump optical signal, used to power the apparatus 100 or the optical memory gate 200. In addition, other optical components, such as additional resonators, feedback loops, phase shifters, filter cavities, and the like, may be deployed depending on a design of the apparatus 100 or the optical memory gate 200. One example design that performs the blocks of the method 300 is the optical memory gate 200 illustrated in FIG. 2 and described above. At block 312, the method 300 ends.

Figure 4:
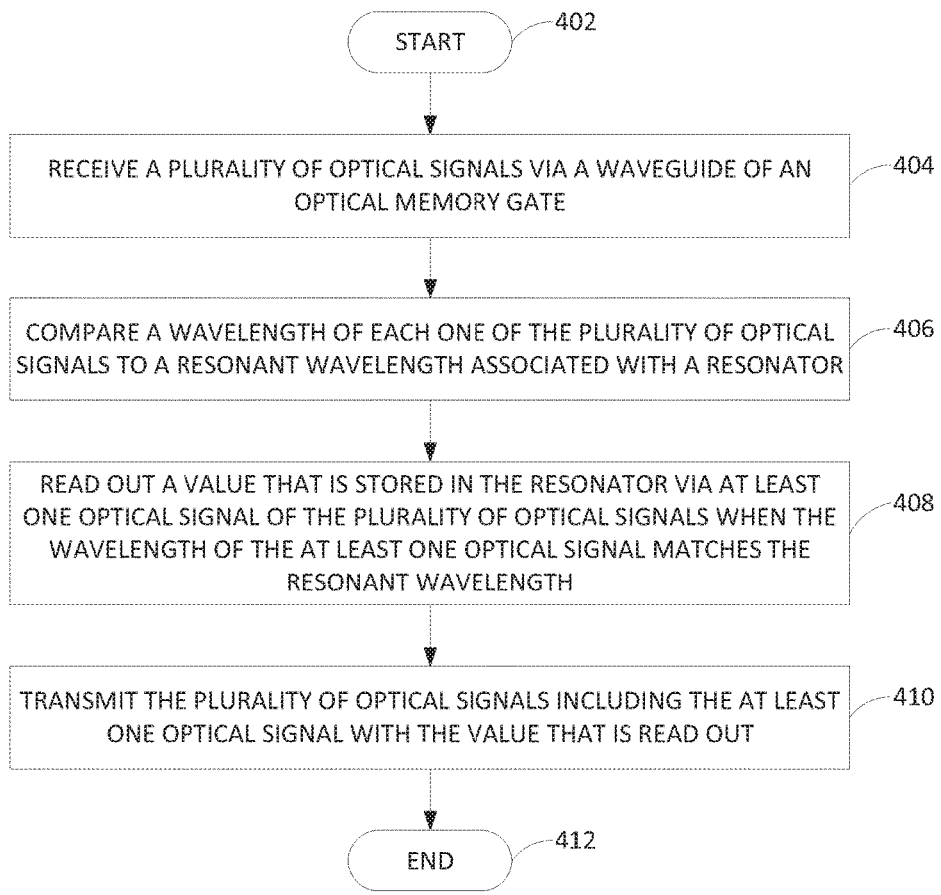
FIG. 4 is a flow diagram of another example method for transmitting an optical signal with a value that was stored in the optical memory gate.

FIG. 4 illustrates a flow diagram of an example method 400 for transmitting an optical signal with a value that was stored in the optical memory gate. In one example, the blocks of the method 400 may be performed by the apparatus 100 or the optical memory gate 200.

At block 402, the method 400 begins. At block 404, the method 400 receives a plurality of optical signals via a waveguide of an optical memory gate. For example, the plurality of optical signals may be a plurality of read out optical signals that is used to read out values stored in a resonator and a pump optical signal used to power the apparatus 100 or the optical memory gate 200. In one example, the plurality of optical signals may each have a different wavelength such that each one of the plurality of optical signals may be processed independently by the same apparatus 100 or the same optical memory gate 200. In other words, a single apparatus 100 or a single optical memory gate 200 may process multiple optical signals having different wavelengths simultaneously.

At block 406, the method 400 compares a wavelength of each one of the plurality of optical signals to a resonant wavelength associated with a resonator. In one implementation, the resonator may be associated with a plurality of different resonant wavelengths and the wavelength of each one of the plurality of optical signals may be compared to all of the resonant wavelengths. The optical signals that match the resonant wavelength may read out the value stored in the resonator. For example, resonator may determine the wavelength associated with each one of the optical signals to determine if the wavelength of any of the optical signals matches the resonant wavelength, or thresholds, associated with the resonator.

At block 408, the method 400 reads out a value that is stored in the resonator via at least one optical signal of the plurality of optical signals when the wavelength of the at least one optical signal matches the resonant wavelength. For example, the resonator may store a value. In one implementation, the resonator may store a value of 1 associated with a high power state and a value of 0 associated with a low power state. When the wavelength of one of the plurality of optical signals matches a resonant wavelength associated with the resonator, the optical signal may read out the value stored in the resonator. For example, when the resonator is storing a value of 1 and is in a high powered state, a phase shift may be applied to the optical signal having a wavelength that matches a resonant wavelength. When the resonator is storing a value of 0 and is in a low powered state, no phase shift may be applied to the optical signal having a wavelength that matches a resonant wavelength indicating that the optical signal has read out a value of 0 from the resonator.

At block 410, the method 400 transmits the plurality of the optical signals including the at least one optical signal with the value that is read out. For example, the plurality of optical signals, including the optical signal or optical signals that have read out the value stored in the resonator, may exit the waveguide via an output. The value may then be processed in accordance with a particular system that deploys the apparatus 100 or the optical memory gate 200.

In some implementations, the blocks described by the method 400 may be deployed with additional optical signals, such as a pump optical signal, used to power the apparatus 100 or the optical memory gate 200. In addition, other optical components, such as additional resonators, feedback loops, phase shifters, filter cavities, and the like, may be deployed depending on a design of the apparatus 100 or the optical memory gate 200. One example design that performs the blocks of the method 400 is the optical memory gate 200 illustrated in FIG. 2 and described above. At block 412, the method 400 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method, comprising:
   receiving at least one optical signal via a waveguide of an optical memory gate;
   comparing a wavelength of the at least one optical signal to a resonant wavelength associated with a resonator;
   reading out a value that is stored in the resonator via the at least one optical signal when the wavelength of the at least one optical signal matches the resonant wavelength;
   transmitting the at least one optical signal with the value that is read out;
   receiving an optical pump signal associated with a power level;
   routing the optical pump signal into a feedback loop via a second resonator that applies a phase shift to the optical pump signal; and
   monitoring a total power level of the optical memory gate.

2. The method of claim 1, wherein the value comprises a 0 when the resonator is in a low power state or a 1 when the resonator is in a high power state.

3. The method of claim 2, wherein the high power state associated with the value of 1 causes a phase shift to be applied to the at least one optical signal.

4. The method of claim 1, wherein the feedback loop filters out the wavelength associated with the at least one optical signal to block the at least one optical signal while allowing the optical pump signal to pass through.

5. An optical memory gate comprising:
   a waveguide along which an optical signal and a pump power optical signal propagate;
   a first resonator in communication with the waveguide, wherein the first resonator stores a value and the optical signal reads out the value stored in the first resonator when a wavelength of the optical signal matches a resonant wavelength associated with the first resonator;
a second resonator in communication with the waveguide, wherein the second resonator applies a phase shift to the pump power optical signal; and
a feedback loop that monitors a total power level of the optical memory gate.

6. The optical memory gate of claim 5, wherein the value comprises a 0 when the first resonator is in a low power state or a 1 when the first resonator is in a high power state.

7. The optical memory gate of claim 5, wherein the feedback loop is in communication with the waveguide via a first coupling device and a second coupling device.

8. The optical memory gate of claim 7, wherein the feedback loop comprises:
   a third resonator, wherein the third resonator stores a respective value that is different than the value stored in the first resonator;
   a first phase shifter downstream from the third resonator and upstream from the second coupling device;
   a second phase shifter downstream from the first phase shifter and upstream from the second coupling device; and
   a cavity filter downstream from the second phase shifter.

9. The optical memory gate of claim 8, wherein the cavity filter allows wavelengths associated with the pump power optical signal to pass and blocks wavelengths associated with the optical signal.

10. A method comprising:
    receiving a plurality of optical signals via a waveguide of an optical memory gate;
    comparing a wavelength of each one of the plurality of optical signals to a resonant wavelength associated with a first resonator;
    reading out a value that is stored in the first resonator via at least one optical signal of the plurality of optical signals when the wavelength of the at least one optical signal matches the resonant wavelength;
    transmitting the plurality of the optical signals including the at least one optical signal with the value that is read out;
    receiving an optical pump signal associated with a power level;
    routing the optical pump signal into a feedback loop via a second resonator that applies a phase shift to the optical pump signal; and
    monitoring a total power level of the optical memory gate.

11. The method of claim 10, wherein the value comprises a 0 when the first resonator is in a low power state or a 1 when the resonator is in a high power state.

12. The method of claim 11, wherein the high power state associated with the value of 1 causes a phase shift to be applied to the at least one optical signal.

13. The method of claim 1, comprising:
    powering, with the optical pump signal, the optical memory gate.

* * * * *